United States Patent [19]

Kolm

[11] 4,081,840
[45] Mar. 28, 1978

[54] DUAL FUNCTION ACOUSTIC SWITCH

[75] Inventor: Eric A. Kolm, Brookline, Mass.

[73] Assignee: Signal Science Systems, Inc., Framingham, Mass.

[21] Appl. No.: 755,212

[22] Filed: Dec. 29, 1976

[51] Int. Cl.² ............................................ H04N 5/44
[52] U.S. Cl. .................................... 358/194; 325/392
[58] Field of Search ..................... 358/194; 179/1 VC; 325/392, 395, 464; 340/148, 171 R; 343/228

[56] References Cited

U.S. PATENT DOCUMENTS

| | | | |
|---|---|---|---|
| 3,628,153 | 12/1971 | Fukata | 325/395 |
| 3,943,451 | 3/1976 | Stoddard | 325/464 |

*Primary Examiner*—Richard Murray
*Attorney, Agent, or Firm*—Cesari and McKenna

[57] ABSTRACT

An acoustic switch for controlling at least two functions of an auxiliary device, such as a television receiver, coupled thereto. A monostable device and a bistable device are coupled to a single tuned transducer. The monostable device is switched from a stable state to an unstable state for a predetermined time interval in response to the reception of an acoustic signal by the transducer. The bistable device is enabled only during the time interval in which the monostable device is in its unstable state. If a second acoustic signal is received by the transducer during this time interval, it switches the bistable device from a first stable state to a second stable state to control one function of the auxiliary device (e.g., power on and off to the television receiver). If a second acoustic signal is not received by the transducer during the monostable time interval, the return of the monostable device to its stable state is used to control another function of the auxiliary device (e.g., to start a channel changing operation). The particular function controlled by the switch is thus determined by whether one or two acoustic signals are received by the transducer within the monostable time interval.

10 Claims, 2 Drawing Figures

DUAL FUNCTION ACOUSTIC SWITCH

BACKGROUND OF THE INVENTION

This invention relates to acoustic control devices and, more particularly, to acoustic switches for remotely controlling the functions of an auxiliary device coupled thereto.

There are many remote control devices which have been devised to respond to signals transmitted from remote locations for control of auxiliary devices. These devices can be arranged to respond to signals in various frequency ranges and in the past have been relatively complex. An improvement in these devices is disclosed in my copending application Ser. No. 474,875, filed on May 31, 1974, now U.S. Pat. No. 3,970, 987. This improved device is arranged to be responsive to acoustic signals in the sonic and ultrasonic frequency range and, in response to these signals, to control a function of an auxiliary electrical device. A specific application of this device for remotely controlling the channel selection function of a television receiver is disclosed in my copending application Ser. No. 567,410, filed on June 11, 1975, now U.S. Pat. No. 3,988,680.

Though the devices disclosed in the above-referenced applications work quite satisfactorily, there are possibilities for improving their operation. For example, the remote control devices described above can readily control only one function of the auxiliary device to which they are coupled. Thus, the devices may be adapted for controlling the electrical power to the television receiver, or the channel selection function of the television receiver, but not both functions. In the television remote control unit disclosed in Ser. No. 567,410, for example, the channel selection function is controlled by the acoustic switch, but the electrical power to the receiver is controlled by a mechanical switch arranged to operate at only one position of a tuner.

In my copending application Ser. No. 476,439, filed on June 5, 1974, now U.S. Pat. No. 3,892,920, an acoustic remote control device is disclosed which can readily control more than one function of an auxiliary device coupled thereto. This device employs two separate tuned transducers which are alternately activated to respond to acoustic signals in a predetermined frequency range.

When a first of the transducers is activated, a bistable device coupled thereto is switched between a first and second stable state in response to an acoustic signal detected by the first transducer to control one function of the auxiliary device. When a second of the transducers is activated, a monostable device coupled thereto is switched between a stable and an unstable state in response to an acoustic signal detected by the second transducer to control another function of the auxiliary device. When used, for example, to control a television receiver, the device can thus control both the channel selection function of the receiver and the flow of electrical power to the receiver independently of the position of the tuner in the receiver. It would be desirable to have a device which possesses the multiple function control capabilities of the acoustic remote control device disclosed is Ser. No. 476,439, and which is also simpler in construction and less expensive to produce.

SUMMARY OF THE INVENTION

It is, therefore, a general object of the present invention to provide an improved acoustic remote control device which can readily control more than one function of an auxiliary device coupled thereto.

Another object of the invention is to provide such an acoustic control device which is relatively simple in construction and relatively low in cost.

Still another object of the invention is to provide such an acoustic control device which employs only a single tuned acoustic transducer.

Still another object of the invention is to provide such an acoustic control device in which the particular function of the auxiliary device controlled is determined by the number of acoustic signals received by the transducer within a predetermined time interval.

In accordance with the present invention, an acoustic switch control device includes a single tuned transducer, a monostable device, and a bistable device. The monostable device and the bistable device are connected to the output of the transducer. The monostable device is maintained in a normally enabled state, and is thus responsive to each acoustic signal received by the transducer. The bistable device is, however, maintained in a normally disabled state and is responsive to acoustic signals recieved only under certain conditions.

Specifically, each acoustic signal received by the transducer is effective in switching the monostable device from s stable state to an unstable state for a predetermined time interval. This time interval is referred to as the monostable window. The bistable device is enabled only while the monostable device is in its unstable state (i.e., only during the monostable window). If a second acoustic signal is received by the transducer during the monostable window, it switches the bistable device from a first stable state to a second stable state to control one function of an auxiliary device coupled thereto. If a second acoustic signal is not received during the monostable time interval, the monostable device returns to its stable state at the expiration of the time interval. The switching of the monostable device to its stable state is used to control another function of the auxiliary device. The particular function of the auxiliary device controlled is thus determined by the number of acoustic signals received by the transducer within the time interval determined by the monostable device.

BRIEF DESCRIPTION OF THE DRAWING

The foregoing and other objects, features and advantages of the invention will be better understood from the following detailed description taken in conjunction with the accompanying drawing in which.

DETAILED DESCRIPTION OF ILLUSTRATIVE EMBODIMENT

Figure 1:
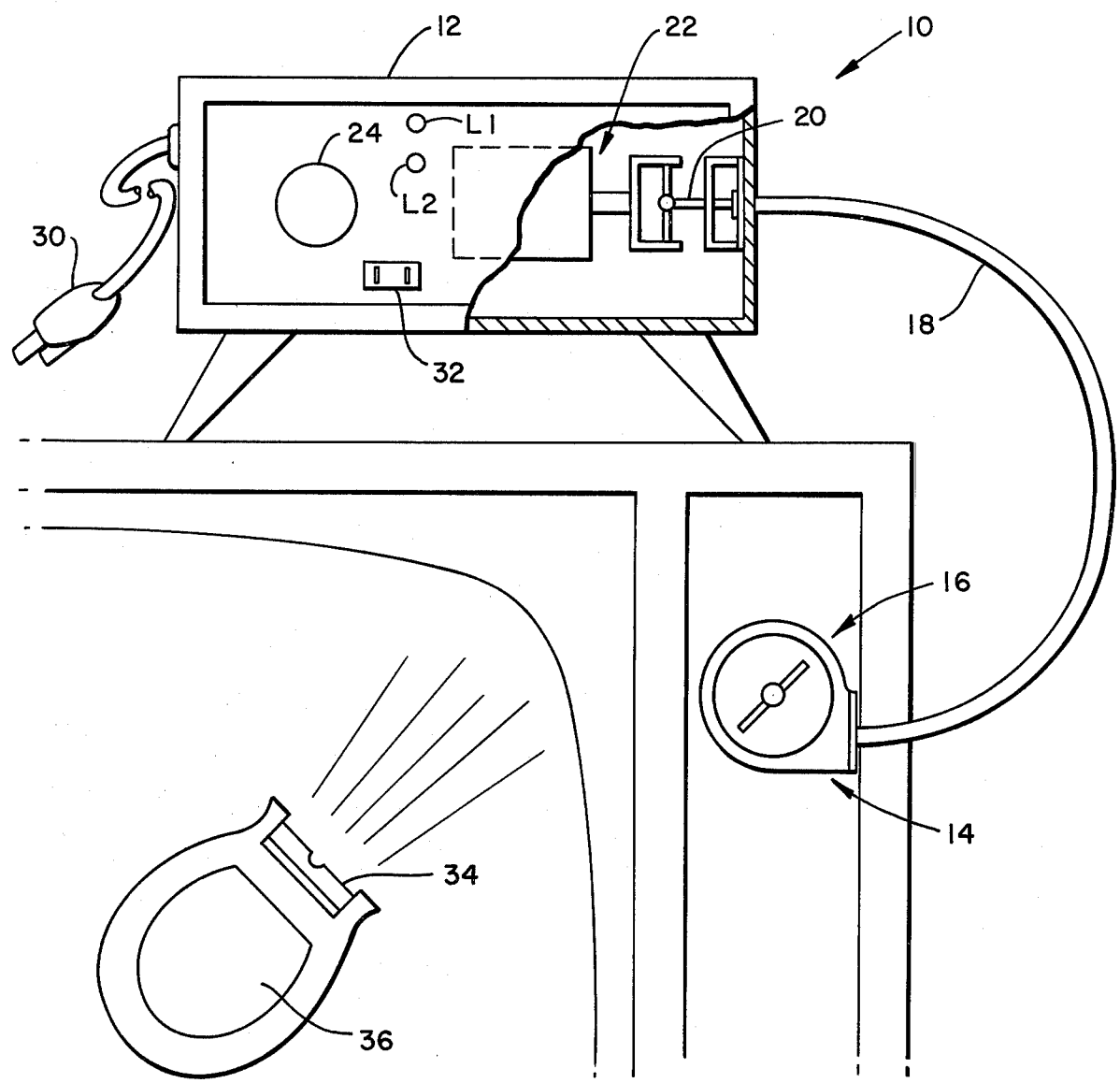
FIG. 1 is a front view, partly broken away, of an acoustic switch control unit embodying the invention, connected to control the operation of a television receiver.

As shown in FIG. 1, an acoustic switch control unit generally depicted at 10 comprises a housing 12 located on top of a conventional television receiver 14. The housing 12 is connected to a channel changing adapter 16 by way of a cable 18. The adapter 16 is fitted to the shaft (not shown) of the tuner in the receiver 14, and when actuated by means of a movable shaft 20 within the cable 18, it advances the tuner from one television channel to the next.

More specifically, the shaft is actuated by a solenoid actuator 22 which is energized to pull the shaft 20 to the left each time the television channel is to be changed. The actuator 22, adapter 16 and associated parts are preferably as described in my above-referenced copending application Ser. No. 567,410, U.S. Pat. No. 3,988,680 the disclosure of which is expressly incorporated herein by reference.

The unit 10 also includes a plug 30 for connection to any standard household electrical receptacle and a receptacle 32 into which the receiver 14 is plugged.

In the housing 12, there is an acoustic transducing assembly comprising a perforated screen 24 and an acoustic transducer, to be described below, disposed behind the screen 24. To control the various functions of the receiver 14, the user activates from a remote location an acoustic transmitter 34 to emit an acoustic signal within a predetermined frequency range to which the acoustic transducer in the unit 10 is designed to respond. Transmitter 34 is illustratively a whistle that emits a blast in the lower ultrasonic region when an attached bulb 36 is squeezed. Typically, its signal has a center frequency of about 14 KHZ and a bandwidth of about 5 KHZ.

The housing 12 also contains electronic circuitry for effecting operation of the channel changing function and turning electrical power to the receiver 14 on and off. This electronic circuitry operates in response to the acoustic signals received by the acoustic transducer in the unit 10, and will now be explained with reference to FIG. 2 of the drawing.

Figure 2:
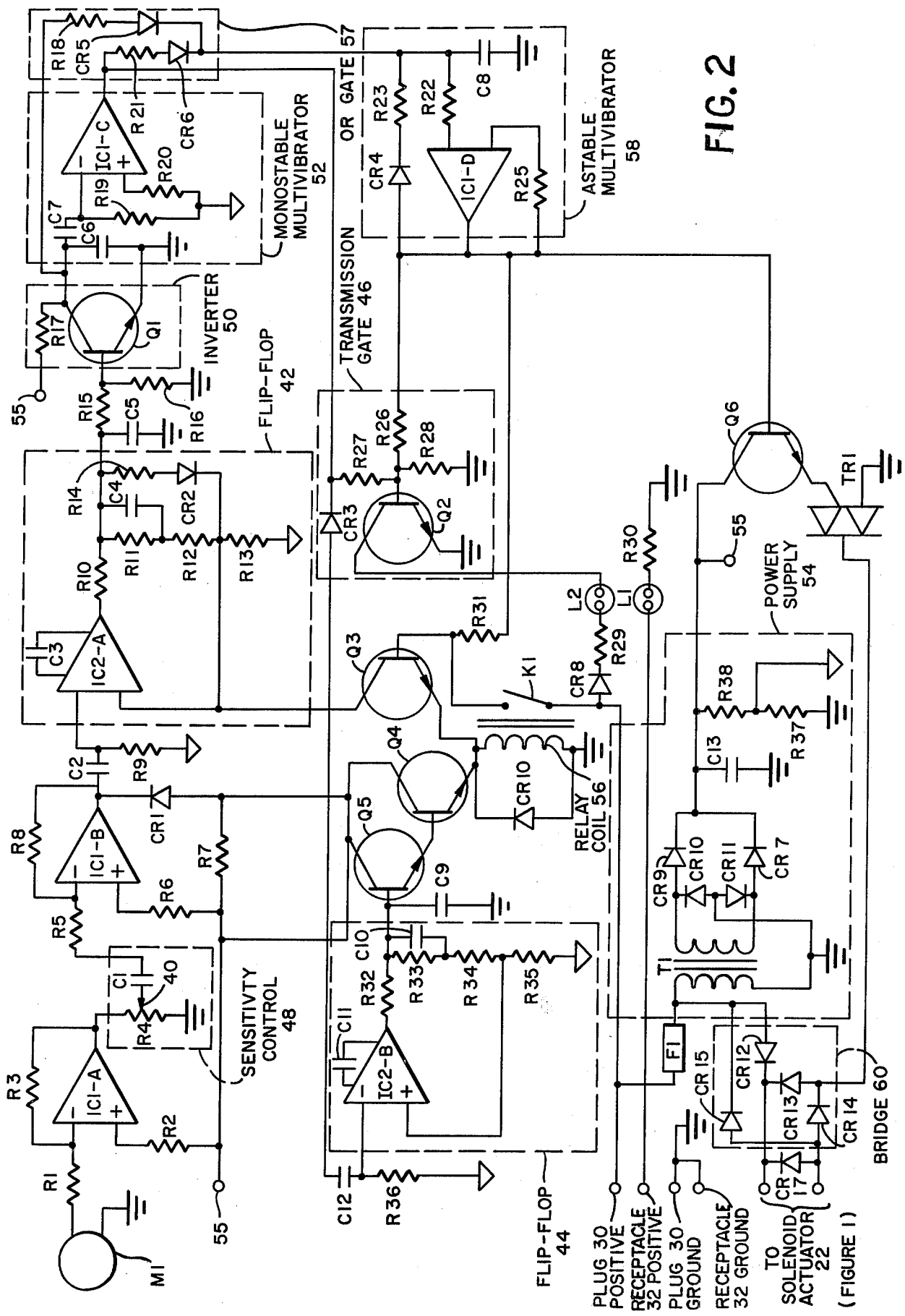
FIG. 2 is a schematic diagram of the circuitry in the acoustic switch control unit of FIG. 1.

As shown in FIG. 2, the electronic control circuitry of the unit 10 includes a single acoustic transducer or microphone M1 which is tuned to responsd to the acoustic frequencies emitted by the transmitter 34. The transducer M1 is illustratively of a bilaminar construction and is tuned to a self-resonance of 14 KHZ.

The circuit of FIG. 2 operates generally as follows. An acoustic signal transmitted using the transmitter 34 (FIG. 1) and received by the transducer M1 causees a monostable device (i.e., monostable multivibrator 52) to switch from a stable state to an unstable state for a predetermined time interval. A bistable device (i.e., flip-flop 44) is such that it is enabled only during the time interval in which the monostable device is in its unstable state. If a second acoustic signal is transmitted and received during this time interval, the bistable device is switched from a first stable state to a second stable state. This switch in the bistable output is used to control one function of the television receiver 14; namely, the flow of electrical power thereto. Power to the receiver 14 is thus turned on and off by transmitting two acoustic signals within the monostable time interval.

If a second acoustic signal is not received during the monostable time interval caused by the first, earlier signal, the bistable output does not switch and the monostable device returns to its stable device. The return of the monostable device to its stable state is used to inititate another function of the receiver 14; namely, to start a channel changing operation. The circuitry is such that it automatically and continually advances the tuner from one channel to the next. The tuner is stopped at a desired channel by transmitting an additional, single acoustic signal when the desired channel is reached.

More specifically, in the illustrative embodiment shown in FIG. 2, an acoustic signal transmitted by the transmitter 34 (FIG. 1) is received by the transducer M1 and converted thereby to an electrical signal. The electrical signal is coupled through resistor R1 to an amplifier IC1-A with its associated external resistor R3. The amplifier IC1-A is illustratively one of four such amplifiers (e.g., IC1-A, -B, -C and -D) contained on a single integrated circuit chip IC1 in the circuitry. The resistors R1 and R3 are selected so that the amplifier IC1-A amplifies the electrical signal by a factor of 40.

Amplifier IC1-A connects to a sensitivity control 48 comprising resistor R4 and variable tap 40. When the unit 10 is to be employed in a relatively quiet environment, the tap 40 may, be set so as to provide a minimum attenuation of the signal from amplifier IC1-A and thereby expand the distance range over which the transmitter 34 (FIG. 1) is effective in actuating the unit 10. Conversely, in a noisy enviroment, the tap 40 may be set to provide a maximum attenuation of the signal to minimize false triggering of the unit 10 due to random noise.

Electrical power is supplied to amplifier IC1-A and each of the other components in the circuit of FIG. 2 by a power supply 54. As shown in FIG. 2, the power supply 54 is electrically connected to the positive line of plug 30 (FIG. 1) through a fuse F1. The power supply 54 includes a step-down transformer T1, a rectifier bridge comprising diodes CR7, CR9, CR10 and CR11 and a resistive-capacitive network including R37, R38 and C13 which supplies a positive d.c. voltage at power supply terminal 55. The terminal 55 is connected to all terminals referenced by the numeral 55 throughout the circuitry of FIG. 2 to provide the necessary operating potential to the components.

Variable tap 40 connects through capacitor C1 and resistor R5 to a second amplifier IC1-B with its associated external resistor R8. The amplifier IC1-B illustratively further amplifies the signal by a factor of 100.

Amplifier IC1-B connects through capacitor C2 and resistor R9 to a first bistable device or flip-flop 42 and through diode CR1 and capacitor C12 to a second bistable device or flip-flop 44. Each flip-flop 42 and 44 includes an amplifier IC2-A and IC2-B, respectively, both of which are illustratively contained on a single integrated circuit chip IC2 separated from the chip IC1. The signal at the output of amplifier IC1-B causes a shift in the output of flip-flop 42 from a logic "zero" level to a logic "one" level. The signal at the output of amplifier IC1-B is, however, blocked from the flip-flop 44 by a transmission gate 46 which is described more fully below.

Flip-flop 42 couples through capacitor C5 and resistors R15 and R16 to an inverter 50. The inverter 50, which includes transistor Q1 and associated components R17, C6 and C7, inverts the "one" level output of the flip-flop 42 to a "zero" level.

Monostable multivibrator 52 is responsive to the shift in the output of the inverter 50 to produce a "one" level output pulse of a predetermined duration. The monostable 52 includes amplifier IC1-C capacitors C6 and C7 and resistors R19 and R20. The values of these latter components determine the duration of the monostable output pulse, which is illustratively selected to be 5 seconds. This five second pulse is hereinafter referred to as the monostable "window".

The transmission gate 46, which comprises diode CR3, transistor Q2 and resistors R26 through R28, is enabled by the one level output pulse from the monostable multivibrator 52. More specifically, the gate 46 allows a signal appearing at the output of amplifier IC1-B to be coupled through diode CR1 and capacitor C12 to the second flip-flop 44 only if that signal is present during the five second window caused by a previous signal. Thus, the flip-flop 44 is affected only if a second acoustic signal is received within five seconds of a first, earlier signal.

It is assumed that a second acoustic signal is in fact received within five seconds of the first acoustic signal. The second signal, like the first signal, appears at the output of amplifiers IC1-A and IC1-B. However in this case the output of amplifier IC1-B is coupled to flip-flop 42 and simultaneously to flip-flop 44. The output of flip-flop 42 thus shifts back to a zero level, while the output of flip-flop 44 shifts from a zero level to a one level. The latter shift energizes transistors Q4 and Q5 which, in turn, energize a relay coil 56 to close a relay K1. Closing the relay K1 causes electrical power to flow from the plug 30 (FIG. 1) to the receptacle 32 (FIG. 1) and thus to the television receiver 14 (FIG. 1). The receiver 14 is thus turned on, and will remain on until additional acoustic signals are received by the unit 10.

Power to the receiver 14 is turned off by causing the output of flip-flop 44 to shift back to a zero level, thereby de-energizing the transistors Q4 and Q5 and opening the relay K1. The output of flip-flop 44 is shifted by again transmitting two acoustic signals within five seconds of each other. The first of the two signals causes the monostable multivibrator 52 to generate a window and therefore enables the transmission gate 46, while the second signal causes the desired shift in the output of the flip-flop 44.

As noted, when the receiver 14 is on, the output of the flip-flop 42 is at a zero level. If an acoustic signal is received by transducer M1 while the receiver 14 is on, the output of flip-flop 42 will again shift from a zero level to a one level, and the monostable multibrator 52 will produce still another window. If a second acoustic signal is not received during this window, the window simply terminates after five seconds. An OR gate 57, which comprises resistors R18, R21 and rectifiers CR5 and CR6, couples to outputs of inverter 50 and monostable multivibrator 52 to an astable multivibrator 58. The OR gate 57 is such tat its output is at a zero level when the outputs of the inverter 50 and monostable multivibrator 52 are both at zero levels and is at a one level when either of the outputs of the inverter 50 or monostable multibrator 52 is at a one level. Thus, as the window terminates after five seconds, the output of the OR gate 57 shifts to a zero level.

The astable multivibrator 58, which comprises amplifier IC1-D, resistors R22, R23 and R25 and capacitor C3, responds to the zero output of the OR gate 57 by emitting a series of periodic pulses and continues to emit these pulses as long as the OR gate output is zero. These pulses, which are illustratively of a one second duration and spaced at two second intervals periodically energize a transistor Q6. The emitter of the transistor Q6 is connected to the gate electrode of a triac TR1. With eachh pulse from the astable multivibrator 58, the transistor Q6 applies sufficient gate current to the triac TR1 to provide anode-cathode conduction therethrough. Power thus passes from the positive line of the plug 30 through the fuse F1 to a rectifier bridge 60 comprising diodes CR12 through CR15. The bridge 60, in turn, emits a d.c. voltage pulse which energizes the solenoid actuator 22 (FIG. 1) in the unit 10 to initiate a channel changing function in the receiver 14. The d.c. pulse from the bridge 60 persists for the duration of the pulse from the astable multivibrator 58 (i.e., about one second) and thus provides sufficient time for the actuator 22 to complete one channel change. Each pulse from the astable multivibrator 58 causes the actuator 22 to be activated and the tuner in the receiver 14 to be advanced one channel. The unit 10 automatically and continually advance the tuner one channel about every three seconds until the channel changing process is stopped.

As indicated, the solenoid actuator 22 is preferably a D.C. responsive device. A.C. responsive solenoid actuators tend to hum due to eddy currents and this hum can be erroneously detected by the transducer M1 as an acoustic control signal. D.C. solenoides are also generally more efficient than A.C. solenoids. Thus, by using the D.C. solenoid actuator 22, the physical size of the component and amount of current drawn thereby can be kept to a minimum.

The channel changing process is stopped by deactivating the astable multivibrator 58. This is accomplished by transmitting another acoustic signal to the unit 10. The signal causes the output of flip-flop 42 to shift from a one level back to a zero level and the output of the inverter 50 to shift to a one level. The output of OR gate 57, in turn, shifts to a one level. This latter shift deactivates the astable multivibrator 58 and the solenoid actuator 22. The channel changing process stops on the channel occupied by the tuner at the time the acoustic signal is received.

The solenoid actuator 22 is spaced rather closely to the transducers M1 in the unit 10. When activated to initiate a channel change, the actuator 22 generates noise which, because of its proximity to the transducer M1, is quite severe and which can include overtones in the 14 KHz range. An override component comprising a transistor Q3 is included in the circuitry to prevent these actuator overtones from being erroneously interpreted as a received acoustic signal and thus erroneously turning the power to the receiver 14 off when a channel change is made.

Specifically, the base of the transistor Q3 is connected through a resistor R31 to the output of the astable multivibrator 58. The emitter of the transistor Q3 is connected to the positive side of the relay coil 56 and the collector of the transistor Q3 is connected to the positive (i.e., set) input to the amplifier IC2-A in the flip-flop 42. The transistor Q3 is energized by each output pulse from the astable multivibrator 58.

If the relay coil 56 is energized (i.e., power to the receiver 14 is on), the transistor Q3 transmits a set pulse to the amplifier. This prevents the actuator noise from switching power to the receiver 14 off during the channel change.

If the relay coil 56 is not energized (i.e., power to the receiver 14 is off) and a pulse occurs at the output of the astable multivibrator 58, the transistor Q3 will transmit a reset pulse to the amplifier IC2-A which resets the flip-flop 42 and shifts the output to a zero level. This prevents extraneous noises which occur while the receiver 14 is off from causing the unit 10 to turn the receiver 14 on unintentionally.

Lamps L1 and L2, which, as indicated in FIG. 1, are visible through the front panel of the housing 12, are adapted to provide a visual indicated to a user of the various operative states of the unit 10. As can be appreciated from FIG. 2, the lamp L1 will be on when the power to the receiver 14 is on (i.e., the relay switch k1 is closed off) and off when the power to the receiver is off (i.e., the relay switch K1 is open) and the lamp L2 is pulsed on for the duration of each output pulse from astable multivibrator 58 and is thus pulsed on for each channel change. The lamps L1 and L2, which may be neon bulbs, are preferably of different colors, such as green and red, respectively, so that they are readily distinguishable by the user of the unit 10.

It is noted that the power flow function and channel changing function of the unit 10 are completely independent of one another. Since two acoustiic signals are required within a five second period to turn the receiver 14 on or off, the output of the flip-flop 42 always returns at a zero level after a power change. The inverter 50 thus always returns to a one level and prevents the OR gate 57 from actuating the astable multivibrator 58. Thus, power to the receiver 14 may be switched on or off without initiating a channel change.

Also, a channel change is initiated by sending a single acoustic signal while the receiver 14 is on but the unit 10 does not actually start the channel change process until the five second window caused by that signal terminates. Thus, while the channels are being changed, the transmission gate 46 is disabled. The acoustic signal that is sent to stop the channel changing process is thus blocked from flip-flop 44 and prevented from switching the power to the receiver 14 on or off.

Further illustrative characteristics of the various components in the circuitry of FIG. 2 are as follows:

| Component | Description |
| --- | --- |
| R1, R3, R10, R32 | 27 Kohm, 5%, ¼ watt, carbon film resistors |
| R2, R6, R11, R33 | 212 Megohm, ± 5%, ¼ watt, carbon film resistors |
| R3, R8, R12, R25, R34 | 1 Megohm, ± 5%, ¼ watt, carbon film resistors |
| R4 | 10 Kohm, ± 20%, carbon linear tapes potentiometer |
| R5, R7, R16, R17, R28 | 10 Kohm, ± 5%, ¼ watt, carbon film resistors |
| R9, R13, R15, R19, R24, R35, R36 | 100 Kohm, ± 5%, ¼ watt, carbon film resistors |
| R13, R21, R22 | 470 Kohm, ± 5% ¼ watt, carbon film resistors |
| R20 | 120 Kohm, ± 5%, ¼ watt, carbon film resistor |
| R23 | 15 Kohm, ± 5%, ¼ watt, carbon film resistor |
| R26, R27, R29, R30 | 47 Kohm, ± 5%, ¼ watt, carbon film resistors |
| R37, R39 | 5.1 Kohm, ± 5%, ¼ watt, carbon film resistors |
| R40 | 1 Kohm, ± 5%, ¼ watt, carbon film resistor |
| C1 | 0.003 micro-farad, ± 10%, ceramic capacitor |
| C2, C3, C11, C12 | 100 pico-farad, ± 20%, ceramic capacitors |
| C4, C10 | .47 micro-farad, ± 20%, mylar capacitors |
| C5, C8, C9 | 4.7 micro-farad, 16 volt, electrolytic capacitors |
| C6 | 100 micro-farad, 16 volt dc, electrolytic capacitor |
| C7 | 47 micro-farad, 16 volt dc, electrolytic capacitor |
| C13 | 470 micro-farad, 25 volt dc, electrolytic capacitor |
| C14 | 0.005 micro-farad, 1400 volt, ceramic capacitor |
| CR1, CR2, CR3, CR4, CR5, CR6 | IN4148 diodes |
| CR7, CR9, CR10 CR11, CR16 | IN4001 rectifiers |
| CR8, CR12, CR13, CR14, CR15, CR17 | IN4004 rectifiers |
| TR1 | RCA T2800B triac |
| IC1 | CA3401 quad operational amplifier |
| IC2 | ML1437 dual operational amplifier |
| Q1, Q3, Q4, Q5, Q6 | PB3565 transistors |

| -continued | |
| --- | --- |
| Component | Description |
| Q2 | PN5831 transistor |
| K1 | 1000 ohm coil, 3 amp contact relay |
| L1 | G2B green neon lamp |
| L2 | A1C red neon lamp |
| F1 | 5 amp, fast acting fuse |
| T1 | 117 volt AC primary, 12 volt secondary transformer |

In summary, therefore, it can be seen that when power to the television receiver 14 of FIG. 1 is off, two blasts of the transmitter 34 within a time interval of approximately 5 seconds will be effective in turning power to the television receiver on. A subsequent, individual blast of the transmitter 34 will be effective in activating the channel changing adapter 16 to advance the tuner in the receiver 14 from channel to channel. Another individual blast of the transmitter 34 will stop the tuner at a desired channel. Two additional blasts of the transmitter 34 within a time interval of 5 seconds will be effective in turning power to the receiver 14 off.

It is understood that the unit described above is illustrative only of one possible embodiment of the invention. Numerous modifications of the unit will be recognized by those skilled in the art without departing from the scope of the invention as defined by the appended claims. For example, the control unit 10 may be readily adapted to control the functions of electrical devices other than the television receiver 14 described above. The acoustic transmitter 34 need not be of the type described, but may be a device which operates electonically to emit tones within the desired frequency range. Also, the specific components and arrangement of components in the circuitry of FIG. 2 may be varied depending upon the particular application of the unit. For example, the respective gains of the amplifiers IC1 - A and IC1 - B may be increased or decreased to vary the sensitivity of the unit 10 for different applications. The duration of the monostable window may be adjusted to suit those who desired shorter or longer reaction times. The relay K1 would be replaced by a triac like the triac TR1. Other modifications will now be obvious to those skilled in the art.

What is claimed as new and desired to secure by Letters Patent of the United States is:

1. An acoustic switch responsive to remotely generated acoustic signals in a predetermined frequency range for controlling at least two functions of an auxiliary device connected thereto, comprising:
   A. a tuned transducer;
   B. switch means switchable between first and second output states responsive to each acoustic signal received by said transducer;
   C. means responsive to said switch means switching to its second state for generating an output pulse of a predetermined duration;
   D. first control means responsive to the receipt of an acoustic signal by said transducer during the output pulse generated by said generating means for initiating control of a first function of the auxiliary device; and
   E. second control means responsive to said switch means being in its second state and to the termination of the output pulse generated by said generating means for initiating control of a second function of the auxiliary device, whereby the particular function controlled by said switch is determined by whether one or more acoustic signals are received by said transducer within said predetermined duration.

2. An acoustic switch as recited in claim 1 in which said switch means comprises a first bistable switch the output of which is switched between first and second states responsive to each acoustic signal received by said transducer.

3. An acoustic switch as recited in claim 2 in which said first control means includes
   i. a second bistable switch the output of which is switched between first and second states responsive to an acoustic signal received by said transducer,
   ii. gate means connected to said generating means for enabling said second bistable means for the duration of the output pulse from said generating means, and
   iii. means connected to the output of said second bistable means for controlling the first function of the auxiliary device.

4. An acoustic switch as recited in claim 3 in which the auxiliary device to be controlled comprises a television receiver and in which said means connected to the output of said second bistable means comprises a relay for switching electrical power on and off to the receiver.

5. An acoustic switch as recited in claim 2 in which said generating means comprises a monostable switch having a stable and unstable output state, said monostable switch switching to its unstable state for said predetermined duration in response to the output of said first bistable switch switching to its second state.

6. An acoustic switch as recited in claim 2 in which said second control means includes
   i. gate means responsive to said first bistable switch being in its second state and to the termination of the output pulse from said generating means for producing an enabling signal and responsive to said first bistable switch being switched to its first state for producing a disabling signal.
   ii. astable switch means responsive to the enabling signal from said gate means for emitting a pulsed output signal and responsive to the disabling signal from said gate means for terminating the pulsed output signal, and
   iii. means responsive to the pulsed output signal from said astable switch means for controlling the second function of the auxiliary device.

7. An acoustic switch as recited in claim 6 in which the auxiliary device to be controlled comprises a television receiver including a channel selecting tuner and in which said means reponsive to the pulsed output signal from said astable switch means comprises a solenoid actuator for advancing the tuner from channel to channel.

8. An acoustic switch as recited in claim 7 further including means for disabling said first bistable switch for the duration of each pulse in the pulsed output signal from said astable switch means to prevent said first bistable switch from responding to noise resulting from the activation of said solenoid actuator.

9. An acoustic switch as recited in claim 7 in which said solenoid actuator is a D.C. voltage responsive solenoid actuator.

10. An acoustic switch responsive to remotely generated acoustic signals in a predetermined frequency range for controlling at least two functions of an auxiliary device connected thereto, comprising:
   A. a tuned transducer for converting each acoustic signal received to an electrical signal;
   B. first bistable switch means switchable between first and second output states responsive to each acoustic signal received by said transducer;
   C. monostable switch means responsive to said first bistable switch means switching to its second state for generating an output pulse of predetermined duration;
   D. first control means including
      i. a second bistable switch means switchable between first and second output states responsive to an acoustical signal received by said transducer,
      ii. gate means connected to said monostable switch means for enabling said second bistable switch means for the duration of the output pulse from said monostable switch means, and
      iii. means connected to the output of said second bistable means for controlling a first function of the auxiliary device; and
   E. second control means including
      i. gate means responsive to said first bistable switch means being in its second state and to the termination of the output pulse from said monostable switch means for providing an enabling signal and further responsive to said first bistable switch means being switched to its first state for producing a disabling signal.
      ii. astable switch means responsive to the enabling signal from said gate means for emitting a pulsed output signal and further responsive to the disabling signal for terminating the pulsed output signal, and
      iii. means responsive to the pulsed output signal for controlling a second function of the auxiliary device;
   whereby the first function of the auxiliary device is controlled responsive to the receipt of two acoustic signals within said predetermined duration of each other, control over the second function of the auxiliary device is initiated responsive to the receipt of a single acoustic signal and to the termination of the output pulse from said monostable switch means caused thereby and control over the second function of the auxiliary device is terminated responsive to the receipt a subsequent individual acoustic signal.

* * * * *